United States Patent
Ang et al.

(10) Patent No.: US 7,479,425 B2
(45) Date of Patent: Jan. 20, 2009

(54) METHOD FOR FORMING HIGH-K CHARGE STORAGE DEVICE

(75) Inventors: Chew Hoe Ang, Singapore (SG); Dong Kyun Sohn, Singapore (SG); Liang Choo Hsia, Singapore (SG)

(73) Assignee: Chartered Semiconductor Manufacturing, Ltd, Singapore (SG)

( * ) Notice: Subject to any disclaimer, the term of this patent is extended or adjusted under 35 U.S.C. 154(b) by 308 days.

(21) Appl. No.: 11/039,430

(22) Filed: Jan. 20, 2005

(65) Prior Publication Data
US 2006/0160303 A1 Jul. 20, 2006

(51) Int. Cl.
*H01L 21/76* (2006.01)
(52) U.S. Cl. .................. 438/257; 438/216; 438/261
(58) Field of Classification Search .............. 438/257, 438/216, 261
See application file for complete search history.

(56) References Cited

U.S. PATENT DOCUMENTS

| | | | |
|---|---|---|---|
| 6,445,030 B1 * | 9/2002 | Wu et al. | 257/315 |
| 6,642,573 B1 * | 11/2003 | Halliyal et al. | 257/316 |
| 6,677,640 B1 * | 1/2004 | Sandhu et al. | 257/324 |
| 6,680,509 B1 | 1/2004 | Wu et al. | |
| 6,740,605 B1 | 5/2004 | Shiraiwa | |
| 6,764,898 B1 | 7/2004 | En | |
| 6,790,755 B2 * | 9/2004 | Jeon | 438/591 |
| 6,803,275 B1 * | 10/2004 | Park et al. | 438/257 |
| 6,913,961 B2 * | 7/2005 | Hwang | 438/216 |
| 6,982,230 B2 * | 1/2006 | Cabral et al. | 438/778 |
| 6,998,317 B2 * | 2/2006 | Ono | 438/287 |
| 7,012,299 B2 * | 3/2006 | Mahajani et al. | 257/324 |
| 2002/0130340 A1 * | 9/2002 | Ma et al. | 257/295 |
| 2003/0194853 A1 * | 10/2003 | Jeon | 438/591 |
| 2003/0219947 A1 | 11/2003 | Shin | |
| 2005/0062098 A1 * | 3/2005 | Mahajani et al. | 257/324 |
| 2005/0260357 A1 * | 11/2005 | Olsen et al. | 427/569 |

OTHER PUBLICATIONS

Bunmi Adetutu, Jiankang Bu, Hsing Tseng, "A Novel Floating Trap NVSM"—3 pages, copyright 2002—Motorola, inc.—no other info available.

* cited by examiner

*Primary Examiner*—Steven Loke
*Assistant Examiner*—David Goodwin
(74) *Attorney, Agent, or Firm*—Horizon IP Pte Ltd

(57) ABSTRACT

Structures and methods of fabricating of a floating gate non-volatile memory device. In a first example embodiment, We form a bottom tunnel layer comprised of a lower oxide tunnel layer and a upper hafnium oxide tunnel layer; a charge storage layer comprised of a tantalum oxide and a top blocking layer preferably comprised of a lower hafnium oxide storage layer and an upper oxide storage layer. We form a gate electrode over the top blocking layer. We pattern the layers to form a gate structure and form source/drain regions to complete the memory device. In a second example embodiment, we form a floating gate non-volatile memory device comprised of: a bottom tunnel layer comprised essentially of silicon oxide; a charge storage layer comprised of a tantalum oxide; a top blocking layer comprised essentially of silicon oxide; and a gate electrode. The embodiments also comprise anneals and nitridation steps.

28 Claims, 3 Drawing Sheets

METHOD FOR FORMING HIGH-K CHARGE STORAGE DEVICE

BACKGROUND OF INVENTION

1) Field of the Invention

This invention relates generally to the structure and fabrication of semiconductor devices and more particularly to the fabrication of a dielectric materials for memory devices.

2) Description of the Prior Art

A key issue for floating-gate nonvolatile semiconductor memories (NVMs) is the scaling of the tunneling oxide because the stress-induced leakage current (SILC) limits the tunnel oxide to ~8 nm. This scaling issue is a formidable challenge especially for the emerging system-on-chip (SOC) integrated circuits designs in which programming voltage must be scaled for the NVMs to be compatible with the low voltage logic circuits. Therefore, silicon-oxide-nitride-oxide-silicon (SONOS) charge-trapping based NVM is replacing floating-gate NVM due to its advantages of lower programming voltage, smaller cell size and better endurance over the floating-gate devices. However, retention and erase speed remain as the major challenges for conventional SONOS devices as device and voltage further scale in the future.

The relevant technical developments in the literature can be are described below.

U.S. Pat. No. 6,803,275—Park, et al.—Oct. 12, 2004—NO fabrication process for reducing oxygen vacancy content in bottom oxide layer in flash memory devices.

U.S. Pat. No. 6,680,509—Wu, et al.—Nitride barrier layer for protection of ONO structure from top oxide loss in fabrication of SONOS flash memory.

U.S. Pat. No. 6,790,755—Jeon—Preparation of stack high-K gate dielectrics with nitrided layer.

Bunmi Adetutu, Jiankang Bu, Hsing Tseng, "A Novel Floating Trap NVSM".

US 20030194853 A1—Jeon, Joong—Preparation of stack high-K gate dielectrics with nitrided layer.

U.S. Pat. No. 6,764,898B1—En et al.—shows a SONOS device with High k layers.

US 20030219947—Shin, Yoo-Cheol—Memory device and fabrication method thereof.

U.S. Pat. No. 6,740,605B1—Shiraiwa et al. shows a SONOS like device.

SUMMARY OF THE INVENTION

The embodiments of the present invention provides a structure and a method of manufacturing a memory device.

A first embodiment of a method of fabrication of a floating gate non-volatile memory device comprising the following steps:

forming a bottom tunnel layer over a substrate; the bottom tunnel layer comprised of a lower oxide tunnel layer and a upper hafnium oxide tunnel layer;

in a tunnel anneal step, annealing the bottom tunnel layer in a hydrogen containing atmosphere;

forming a charge storage layer over the bottom tunnel layer;

in a storage anneal step, annealing charge storage layer over the bottom tunnel layer in a nitrogen containing atmosphere;

forming a lower hafnium oxide storage layer over the charge storage layer;

in a block anneal step, annealing the top blocking layer in a nitrogen containing atmosphere;

forming an upper cap oxide storage layer over the lower hafnium oxide storage layer; The lower hafnium oxide storage layer and an upper oxide storage layer form a top blocking layer;

forming a gate electrode over the top blocking layer;

patterning the bottom tunnel layer; the charge storage layer; and top blocking layer to form a gate structure;

forming source/drain regions in the substrate adjacent to the gate structure.

A second embodiment of a method of fabrication of a floating gate non-volatile memory device comprising the following steps:

forming a bottom tunnel layer over a substrate;

in a tunnel anneal step, annealing the bottom tunnel layer in a hydrogen containing atmosphere;

forming a charge storage layer over the bottom tunnel layer;

in a storage anneal step, annealing charge storage layer in a nitrogen containing atmosphere;

forming a top blocking layer over the charge storage layer;

in a block plasma nitridation step, annealing the top blocking layer in a nitrogen containing atmosphere;

forming a gate electrode over the top blocking layer;

patterning the bottom tunnel layer; the charge storage layer; and top blocking layer and the gate electrode to form a gate structure;

forming source/drain regions in the substrate adjacent to the gate structure;

An example first device embodiment of a floating gate non-volatile memory device comprises:

a bottom tunnel layer over a substrate; the bottom tunnel layer comprised of a lower oxide tunnel layer and a upper hafnium oxide tunnel layer;

a charge storage layer over the bottom tunnel layer;

a lower hafnium oxide storage layer over the charge storage layer;

an upper cap oxide storage layer over the lower hafnium oxide storage layer; the a lower hafnium oxide storage layer and an upper oxide storage layer form a top blocking layer;

a gate electrode over the top blocking layer;

source/drain regions in the substrate adjacent to the gate structure.

An example second device embodiment of a floating gate non-volatile memory device comprises:

forming a bottom tunnel layer over a substrate;

a charge storage layer over the bottom tunnel layer;

a top blocking layer over the charge storage layer;

a gate electrode over the top blocking layer;

source/drain regions in the substrate adjacent to the gate electrode.

The claims show other embodiments of the invention.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

I. Overview of Example Embodiments

The present invention will be described in detail with reference to the accompanying drawings. The present invention provides structures and method of forming a memory device.

II. First Example Embodiment

Figure 1:
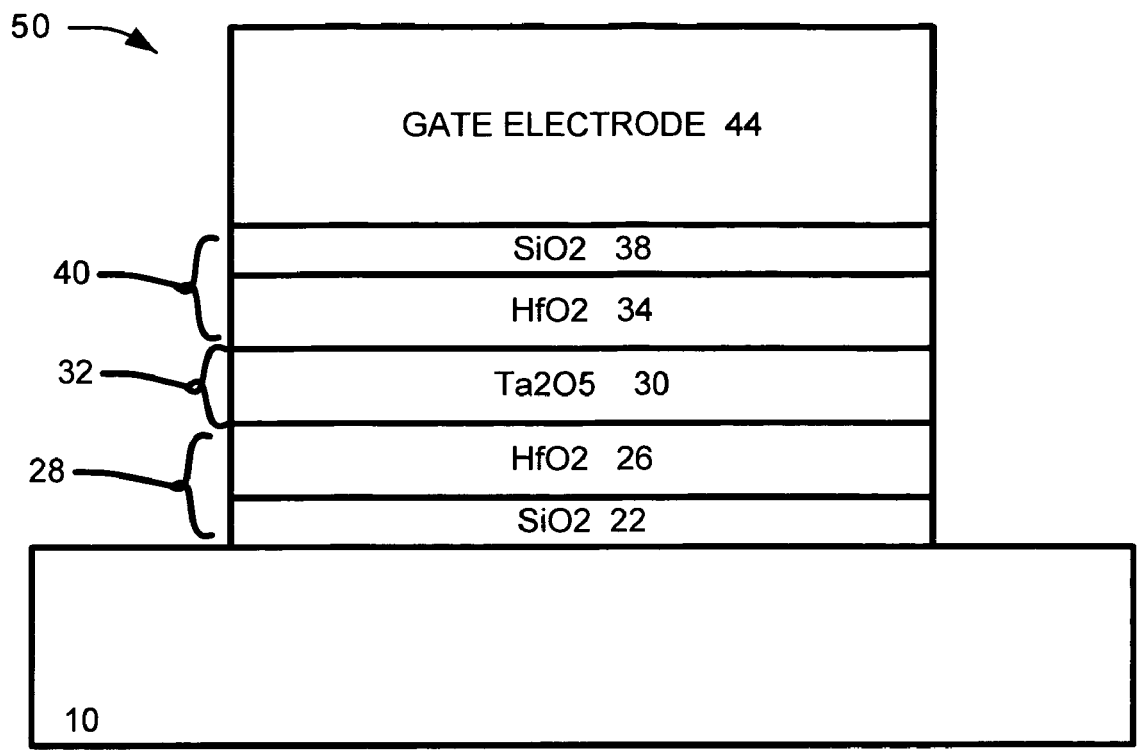
FIG. 1 is a cross sectional view for illustrating a method for manufacturing memory device according to a first example embodiment of the present invention.

The first example embodiment of a memory structure is depicted in FIG. 1. It preferably employs a top blocking layer 40 comprised of $SiO_2/HfO_2$ 38 34, a charge storage layer 32 comprised of $Ta_2O_5$, and a bottom tunnel dielectric 28 comprised of $HfO_2/SiO_2$ 26 22. The top and bottom $SiO_2$ 38 22 are preferably very thin, <1 nm. The ultra-thin interfacial $SiO_2$ layers serves to improve the retention and interfacial quality for the bottom Si and gate electrode. The $HfO_2$ layers can improve the erase speed as compared to a conventional SONOS. The top $HfO_2$ layer 34 thickness preferably ranges from 5 to 20 nm, while the bottom $HfO_2$ layer 26 thickness preferably ranges from 1 to 6 nm. The $Ta_2O_5$ layer 30 preferably thickness ranges from 3 to 8 nm. Using high-k materials allow further device and voltage scaling. They can be deposited using CVD or PVD processes. The gate electrode 44 can be metal or polysilicon.

Figure 3:
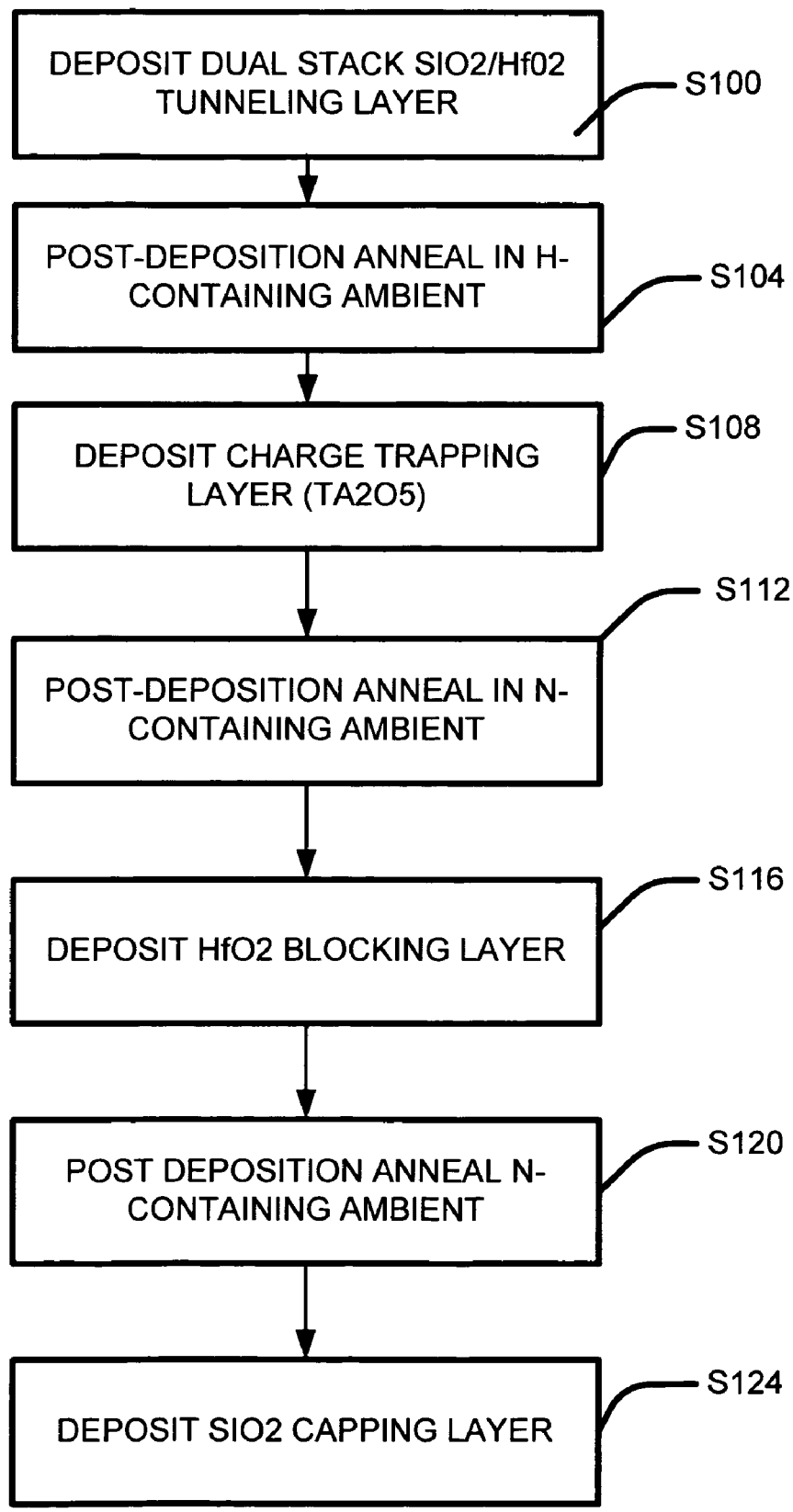
FIG. 3 is a flowchart for illustrating a method for manufacturing memory device according to the first example embodiment of the present invention.

A first example embodiment for a method of fabrication of a floating gate non-volatile memory device is described below and shown in FIGS. 1 and 3. FIG. 3 shows a flowchart of the steps.

A. Bottom Tunnel Layer

Referring to FIG. 1, we provide a semiconductor substrate 10. The substrate can be any suitable semiconductor structure, such as a silicon wafer.

Referring to FIG. 1 and FIG. 3 (step S100), We form a bottom tunnel layer 28 (tunnel insulator) over a substrate 10.

The bottom tunnel layer 28 is preferably comprised of a lower oxide tunnel layer 22 and an upper hafnium oxide tunnel layer 26.

The lower oxide tunnel layer 22 is comprised essentially of silicon oxide and has a thickness between 0.2 nm and 1 nm and more preferably about 0.5 nm.

The upper hafnium oxide tunnel layer 26 is preferably comprised essentially of hafnium oxide (HfO2) and has a thickness between 1 and 6 nm and more preferably about 2.0 nm.

B. Bottom Layer Anneal Step

Referring to FIG. 3, step S104, in an tunnel anneal step, annealing the bottom tunnel layer 28 in a hydrogen containing atmosphere.

The tunnel anneal step comprises an anneal in a H containing atmosphere, such as $NH_3$ or $H_2$, at a temperature between about 300 and 450 degree C. for a time between 5 and 60 seconds.

A H containing anneal is employed prior to the charge trapping layer deposition is important to enhance the bottom layer 28 and interface quality. It is thought that the anneal passivates the Si Dangling bonds at the interface. This in turn improves the retention and endurance of the memory device. It is thought that performing the anneal after the deposition of the overlying charge storage layer is not sufficiently effective due to the H blockage by the charge storage layer.

C. Charge Storage Layer

Referring to FIGS. 1 and 3 (step S108) we form a charge storage layer 32 (charge trapping layer) over the bottom tunnel layer 28.

The charge storage layer 32 is comprised of a tantalum oxide layer 30. The tantalum oxide layer is comprised essentially of tantalum oxide and has a thickness between 3 and 8 nm and more preferably about 5 nm.

D. Charge Trapping Layer Anneal Step

Referring to FIG. 3 (step S112) in the storage anneal step, we anneal the charge storage layer 30 and the bottom tunnel layer 28 in a nitrogen containing atmosphere.

The charge trapping layer anneal step preferably comprises an anneal in a nitrogen containing atmosphere, such as N or $NH_3$, at a temperature between about 300 and 450 degree C. for a time between 15 and 60 seconds. It is thought that the charge trapping layer anneal step eliminates defects in the $Ta_2O_5$ layer and improves its trapping capability.

Overall, it is thought that the first tunnel anneal improves the date retentions capabilities and the second charge trapping layer anneal step improves the charge trapping capabilities.

E. Top Blocking Layer

Referring to FIGS. 1 and 3 (steps S116, S120 and S124) we form a top blocking layer (blocking insulator) 40 over the charge storage layer 32.

The top blocking layer 40 is preferably comprised of a lower hafnium oxide (blocking) layer 34 and an upper oxide (blocking) layer 38. An anneal can be performed between the formation of the lower hafnium oxide layer 34 and the upper oxide layer 38 as shown in FIG. 3.

The lower hafnium oxide layer 34 is preferably comprised essentially of hafnium oxide and preferably has a thickness between 5 and 20 nm.

F. Blocking Layer Anneal Step

Referring to FIG. 3, step S120, in the blocking layer anneal step, we anneal the lower hafnium oxide storage layer 34 in a nitrogen containing atmosphere.

The block anneal step comprises an anneal in a nitrogen or ammonia containing atmosphere, at a temperature between about 300 and 450 degree C. for a time between 15 and 60 seconds.

The blocking layer anneal step is thought to densify the hafnium oxide 34 thus improving it's blocking capability.

G. Upper Oxide Cap Layer

Referring to FIG. 1 and FIG. 3 (step S124), we form the upper oxide cap layer 38.

The upper oxide cap storage layer 38 is preferably comprised essentially of silicon oxide and has a thickness between 0.2 and 1 nm and more preferably about 0.5 nm.

H. A Gate Electrode

Referring to FIG. 1, we form a gate electrode 44 over the top blocking layer 40. The gate electrode 44 is preferably comprised of polysilicon or metal and preferably has thickness between 800 and 2000 Å.

I. Form a Gate Structure

Next, as shown in FIG. 1, we pattern the bottom tunnel layer 28, the charge storage layer 32, and top blocking layer 40 to form a gate structure 50.

J. Source/Drain Regions

Next, we form source/drain regions 14 in the substrate 10 adjacent to the gate structure 50. Preferably the source drain regions are formed by an implant process.

K. Non-Limiting Features of the 1$^{st}$ Embodiment

The first embodiment of the present invention will improve the retention and erase speed over the conventional SONOS, and suitable for further device and voltage scaling.

The retentions and erase speed are improved because (1) band gap engineer—the lower barrier height of hafnium oxide and the deep trap energy level of $Ta_2O_5$.

(2) the three annealing steps—The first anneal improves the interface quality. The second anneal step improves the charge trapping capability by eliminating ht e defects in the dielectric. The third anneal step improves the blocking layer integrity by densifying the hafnium oxide film.

III. Second Example Embodiment

Figure 2:
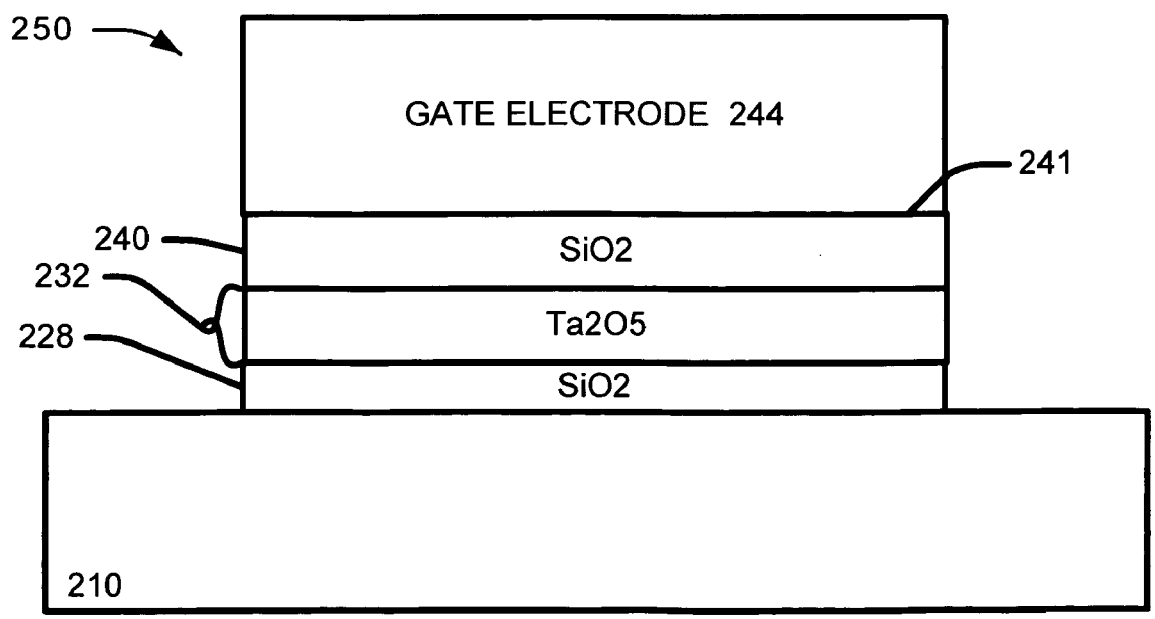
FIG. 2 is a cross sectional view for illustrating a method for manufacturing memory device according to a second example embodiment of the present invention.
Figure 4:
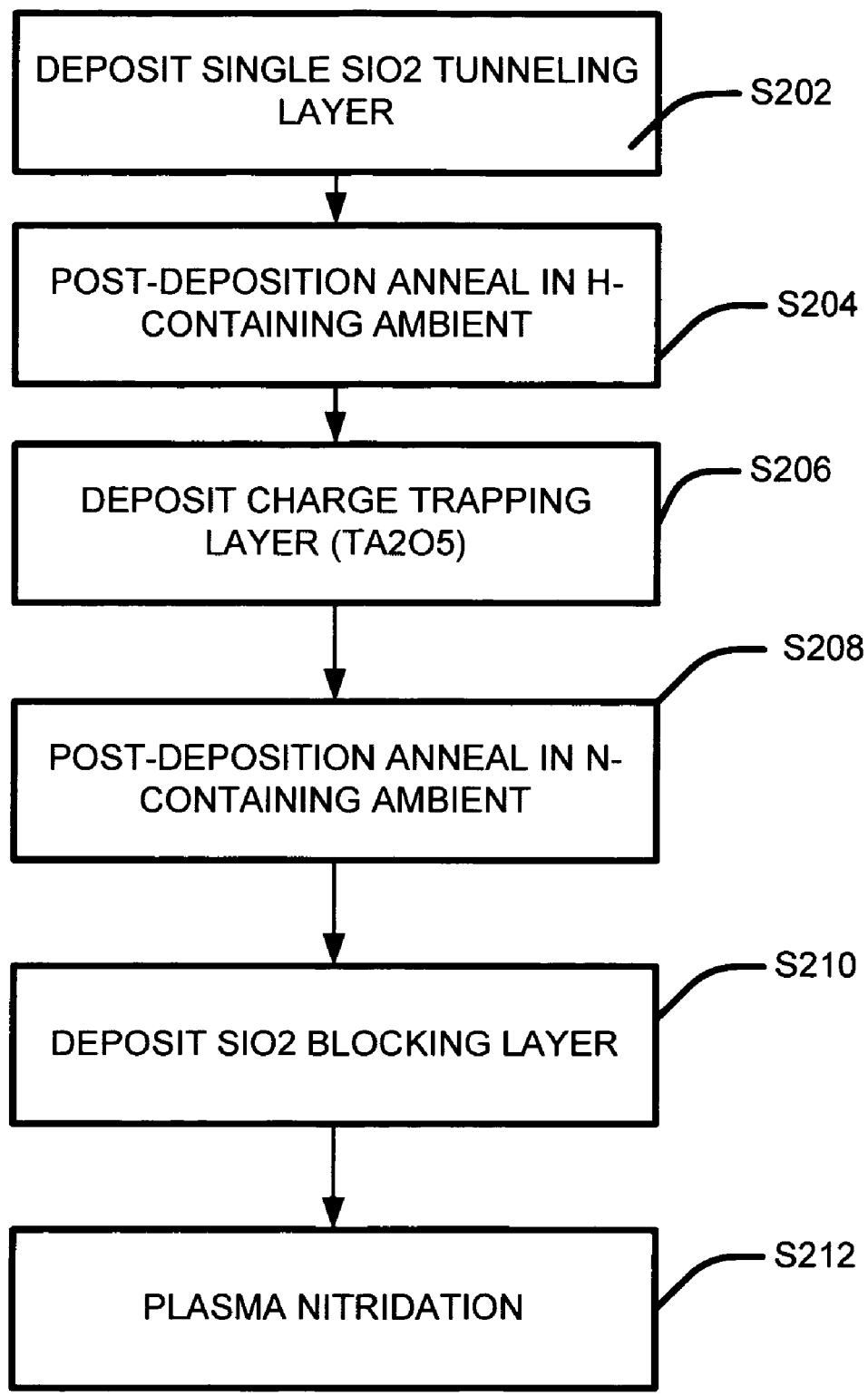
FIG. 4 is a flowchart for illustrating a method for manufacturing memory device according to the second example embodiment of the present invention.

A second example embodiment is shown in FIG. 2 and the flowchart in FIG. 4. Corresponding layers and process can be carried out as described above in the first example embodiment.

The second example embodiment of a memory structure is depicted in FIG. 2. It preferably employs a top blocking layer 240 comprised of $SiO_2$, a charge storage layer 232 comprised of $Ta_2O_5$, and a bottom tunnel dielectric 228 comprised of $SiO_2$. The gate electrode 244 can be metal or polysilicon.

A. A Bottom Tunnel Layer

We provide a substrate. We form a bottom tunnel layer 228 over a substrate 210.

The bottom tunnel layer 228 is preferably comprised essentially of silicon oxide and has a thickness between 1 and 4 nm and more preferably about 2 nm.

B. Bottom Layer Anneal Step

Referring to FIG. 4, step 204, in an optional tunnel nitridation step, annealing the bottom tunnel layer 28 in a nitrogen and hydrogen containing atmosphere.

The tunnel anneal step preferably comprises an anneal in a nitrogen or ammonia containing atmospheres, at a temperature between about 300 and 450 degree C. for a time between 15 and 60 seconds.

The H in the anneal step will passivate the interface. The slight nitridation will be beneficial to improve device reliability due to hot carrier effects.

C. Form a Charge Storage Layer

Next, we form a charge storage layer 232 over the a bottom tunnel layer 28.

The charge storage layer 232 is preferably comprised of a tantalum oxide layer. The tantalum oxide layer is comprised essentially of tantalum oxide and has a thickness between 3 and 8 nm and more preferably about 5 nm.

D. A Charge Trapping Layer Anneal Step

Referring to FIG. 4, step S208, in a charge trapping layer anneal step, annealing charge storage layer 232 in a nitrogen containing atmosphere.

The storage anneal step preferably comprises an anneal in a nitrogen or ammonia containing atmosphere, at a temperature between about 300 and 450 degree C. for a time between 15 and 60 seconds; the RF power ranges from 100 to 500 W (more preferably about 300 W; and the pressure ranges form 5 to 30 mtorr and more preferably about 10 mtorr.

The effects of the anneal are similar as describe above in the first embodiment.

E. Top Blocking Layer

Next, we form a top blocking layer 240 over the charge storage layer 232. The top blocking layer 240 is preferably comprised essentially of silicon oxide and has a thickness between 2 and 10 nm.

F. A Plasma Nitridation Step

Referring to FIG. 4, (step S212, a block nitridation) in a plasma nitridation step, we nitridate the top blocking layer 240 in a nitrogen containing atmosphere. A preferably thin top silicon nitride layer 241 is formed on the surface of the top blocking layer 40.

The top silicon nitride layer 241 is most likely an atomic thickness.

The block nitridation step preferably comprises an anneal in a nitrogen or ammonia containing atmosphere, at a temperature between about 300 and 500 degree C. and more preferably about 350 C; for a time between 20 and 60 seconds.

The plasma nitridation step serves to add a thin layer of silicon nitride on the top the $SiO_2$. This improves the blocking capitilites.

G. Gate Electrode

We form a gate electrode 244 over the top blocking layer 240. The gate electrode is preferably comprised of polysilicon and preferably has a thickness between 800 and 2000 Å.

H. Gate Structure

As shown in FIG. 2, we pattern the bottom tunnel layer 228, the charge storage layer 232, and top blocking layer 240 and the gate electrode 244 to form a gate structure 250.

I. Source/Drain Regions

As shown in FIG. 2, we form source/drain regions 214 in the substrate 10 adjacent to the gate structure 250. This completes the memory device.

J. Features of the Second Embodiment

The second embodiment of the present invention will improve the retention and erase speed over the conventional SONOS, and suitable for further device and voltage scaling.

The embodiments improve retention because:
1) Increase trap density and deep level traps in $Ta_2O_5$.
2) The anneal between the $Ta_2O_5$ and bottom layers help to passivate the Si dangling bonds at the interface. The slight nitrdation also improve reliability and hardness.
3) The second anneal after Ta5O2 improve the film quality and improve the stability.
4) The last anneal adds nitrided layer to improve the blocking capability to reduce over erase issues.

K. Non-Limiting Embodiments

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a non-volatile memory device comprising the steps of:
   a) forming a bottom tunnel layer over a substrate; the bottom tunnel layer comprised of a lower oxide tunnel layer and an upper hafnium oxide tunnel layer;
   b) forming a charge storage layer over the bottom tunnel layer; said charge storage layer is comprised of tantalum oxide;
   b1) in a storage anneal step, annealing the charge storage layer in a nitrogen containing atmosphere;
   c) forming a lower hafnium oxide blocking layer over the charge storage layer;
   d) forming an upper cap oxide layer over the lower hafnium oxide blocking layer; the lower hafnium oxide blocking layer and the upper cap oxide layer form a top blocking layer;
   e) forming a gate electrode over the top blocking layer;
   f) patterning the bottom tunnel layer, the charge storage layer, the upper cap oxide layer, the lower hafnium oxide blocking layer, and the gate electrode to form a gate structure; and
   g) forming source/drain regions in the substrate adjacent to the gate structure.

2. The method of claim 1 which further comprises in a tunnel anneal step performed before the formation of the charge storage layer, annealing the bottom tunnel layer in a hydrogen containing atmosphere.

3. The method of claim 1 which further comprises in a tunnel anneal step performed before the formation of the charge storage layer, annealing the bottom tunnel layer in a hydrogen containing atmosphere comprised of $NH_3$ or $H_2$ at a temperature between about 300 and 450 degrees C. for a time between 5 and 60 seconds.

4. The method of claim 1 wherein the storage anneal step is performed at a temperature between about 300 and 450 degrees C. for a time between 15 and 60 seconds.

5. The method of claim 1 which further comprises in a block anneal step performed after the formation of the lower hafnium oxide blocking layer and before the formation of the upper cap oxide layer, annealing the lower hafnium oxide blocking layer in a nitrogen containing atmosphere.

6. The method of claim 1 which further comprises in a block anneal step performed after the formation of the lower hafnium oxide blocking layer and before the formation of the upper cap oxide layer, annealing the lower hafnium oxide blocking layer in a nitrogen containing atmosphere at a temperature between about 300 and 450 degrees C. for a time between 15 and 60 seconds.

7. The method of claim 1 wherein the lower oxide tunnel layer consists essentially of silicon oxide and has a thickness between 0.2 and 1.0 nm;
   the upper hafnium oxide tunnel layer consists essentially of hafnium oxide and has a thickness between 1 and 6 nm;
   the charge storage layer consists essentially of tantalum oxide and has a thickness between 3 and 8 nm;
   the lower hafnium oxide blocking layer consists essentially of hafnium oxide and has a thickness between 5 and 20 nm; and
   the upper cap oxide layer consists essentially of silicon oxide and has a thickness between 0.2 and 1 nm.

8. The method of claim 1 wherein the upper hafnium oxide tunnel layer is comprised essentially of hafnium oxide and has a thickness between 1 and 6 nm.

9. The method of claim 1 wherein the charge storage layer consists essentially of tantalum oxide and has a thickness between 3 and 8 nm.

10. The method of claim 1 wherein the lower hafnium oxide blocking layer consists essentially of hafnium oxide and has a thickness between 5 and 20 nm.

11. The method of claim 1 wherein
the lower oxide tunnel layer consists essentially of silicon oxide and has a thickness between 0.2 and 1.0 nm: and
the upper cap oxide layer consists essentially of silicon oxide and has a thickness between 0.2 and 1 nm.

12. The method of claim 1 wherein
the lower oxide tunnel layer is on and in contact with the substrate;
the upper hafnium oxide tunnel layer is on and in contact with the lower oxide tunnel layer;
the charge storage layer is on and in contact with upper hafnium oxide tunnel layer; said charge storage layer consists essentially of tantalum oxide;
the lower hafnium oxide blocking layer is on and in contact with the charge storage layer; and
the upper cap oxide layer is on in contact with the lower hafnium oxide blocking layer.

13. The method of claim 1 wherein the lower oxide tunnel layer consists essentially of silicon oxide;
the upper hafnium oxide tunnel layer consists essentially of hafnium oxide; the charge storage layer consists essentially of tantalum oxide;
the lower hafnium oxide blocking layer consists essentially of hafnium oxide; and
the upper cap oxide layer consists essentially of silicon oxide.

14. The method of claim 1 wherein
the lower oxide tunnel layer is on and in contact with the substrate;
the upper hafnium oxide tunnel layer is on and in contact with the lower oxide tunnel layer;
the charge storage layer is on and in contact with the upper hafnium oxide tunnel layer; said charge storage layer consists essentially of tantalum oxide;
the lower hafnium oxide blocking layer is on and in contact with the charge storage layer;
the upper cap oxide layer is on and in contact with the lower hafnium oxide blocking layer;
the lower oxide tunnel layer consists essentially of silicon oxide;
the upper hafnium oxide tunnel layer consists essentially of hafnium oxide; the charge storage layer consists essentially of tantalum oxide;
the lower hafnium oxide blocking layer consists essentially of hafnium oxide; and
the upper cap oxide layer consists essentially of silicon oxide.

15. A method of fabrication of a non-volatile memory device comprising the steps of:
a) forming a bottom tunnel layer over a substrate; the bottom tunnel layer comprised of a lower oxide tunnel layer and an upper hafnium oxide tunnel layer;
b) forming a charge storage layer over the bottom tunnel layer; said charge storage layer is comprised of tantalum oxide;
c) forming a lower hafnium oxide blocking layer over the charge storage layer;
c1) in a block anneal step, annealing the lower hafnium oxide blocking layer in a nitrogen containing atmosphere;
d) forming an upper cap oxide layer over the lower hafnium oxide blocking layer; the lower hafnium oxide blocking layer and the upper cap oxide layer form a top blocking layer;
e) forming a gate electrode over the top blocking layer;
f) patterning the bottom tunnel layer, the charge storage layer, the upper cap oxide layer, the lower hafnium oxide blocking layer, and the gate electrode to form a gate structure; and
g) forming source/drain regions in the substrate adjacent to the gate structure.

16. A method of fabrication of a non-volatile memory device comprising the steps of:
a) forming a bottom tunnel layer over and in contact with a substrate; the bottom tunnel layer comprised of a lower oxide tunnel layer and an upper hafnium oxide tunnel layer; the lower oxide tunnel layer is below and in contact with the upper hafnium oxide tunnel layer;
b) in a tunnel anneal step, annealing the bottom tunnel layer in a hydrogen containing atmosphere;
c) forming a charge storage layer over and in contact with the bottom tunnel layer; said charge storage layer consists essentially of tantalum oxide;
d) in a storage anneal step, annealing the charge storage layer in a nitrogen containing atmosphere;
e) forming a lower hafnium oxide blocking layer over and in contact with the charge storage layer;
f) in a block anneal step, annealing the lower hafnium oxide blocking layer in a nitrogen containing atmosphere;
g) forming an upper cap oxide layer over and in contact with the lower hafnium oxide blocking layer; the lower hafnium oxide blocking layer and the upper cap oxide layer form a top blocking layer;
h) forming a gate electrode over and in contact with the top blocking layer;
i) patterning the bottom tunnel layer, the charge storage layer, and the top blocking layer and the gate electrode to form a gate structure; and
j) forming source/drain regions in the substrate adjacent to the gate structure.

17. The method of claim 16 wherein the lower oxide tunnel layer consists essentially of silicon oxide and has a thickness between 0.2 and 1.0 nm;
the upper hafnium oxide tunnel layer consists essentially of hafnium oxide and has a thickness between 1 and 6 nm;
the charge storage layer consists essentially of tantalum oxide and has a thickness between 3 and 8 nm;
the lower hafnium oxide blocking layer consists essentially of hafnium oxide and has a thickness between 5 and 20 nm; and
the upper cap oxide layer consists essentially of silicon oxide and has a thickness between 0.2 and 1 nm.

18. The method of claim 16 wherein the upper hafnium oxide tunnel layer is comprised essentially of hafnium oxide and has a thickness between 1 and 6 nm.

19. The method of claim 16 wherein the tunnel anneal step comprises an anneal in a hydrogen containing atmosphere, at a temperature between about 300 and 450 degrees C. for a time between 5 and 60 seconds.

20. The method of claim 16 wherein the charge storage layer consists essentially of tantalum oxide and has a thickness between 3 and 8 nm.

21. The method of claim 16 wherein the storage anneal step comprises an anneal in a nitrogen or ammonia containing atmosphere, at a temperature between about 300 and 450 degrees C. for a time between 15 and 60 seconds.

22. The method of claim 16 wherein the lower hafnium oxide blocking layer consists essentially of hafnium oxide and has a thickness between 5 and 20 nm.

23. The method of claim 16 wherein the block anneal step comprises an anneal in a nitrogen or ammonia containing atmosphere, at a temperature between about 300 and 450 degrees C. for a time between 15 and 60 seconds.

24. The method of claim 16 wherein the upper cap oxide layer consists essentially of silicon oxide and has a thickness between 0.2 and 1 nm.

25. The method of claim 16 wherein the tunnel anneal step comprises an anneal in a hydrogen containing atmosphere, at a temperature between about 300 and 450 degrees C. for a time between 5 and 60 seconds;

the storage anneal step comprises an anneal in a nitrogen or ammonia containing atmosphere, at a temperature between about 300 and 450 degrees C. for a time between 15 and 60 seconds; and the block anneal step comprises an anneal in a nitrogen or ammonia containing atmosphere, at temperature between about 300 and 450 degrees C. for a time between 15 and 60 seconds.

26. The method of claim 16 wherein the tunnel anneal step comprises an anneal in a hydrogen containing atmosphere, at a temperature between about 300 and 450 degrees C.;

the storage anneal step comprises an anneal in a nitrogen or ammonia containing atmosphere, at a temperature between about 300 and 450 degrees C.; and the block anneal step comprises an anneal in a nitrogen or ammonia containing atmosphere, at a temperature between about 300 and 450 degrees C.

27. The method of claim 16 wherein the tunnel anneal step comprises an anneal in a hydrogen containing atmosphere, at a temperature between about 300 and 450 degrees C. for a time between 5 and 60 seconds;

the storage anneal step comprises an anneal in a nitrogen or ammonia containing atmosphere, at a temperature between about 300 and 450 degrees C. for a time between 15 and 60 seconds;

the block anneal step comprises an anneal in a nitrogen or ammonia containing atmosphere, at a temperature between about 300 and 450 degrees C. for a time between 15 and 60 seconds;

the lower oxide tunnel layer consists essentially of silicon oxide and has a thickness between 0.2 and 1.0 nm;

the upper hafnium oxide tunnel layer is comprised essentially of hafnium oxide and has a thickness between 1 and 6 nm;

the charge storage layer consists essentially of tantalum oxide and has a thickness between 3 and 8 nm;

the lower hafnium oxide blocking layer consists essentially of hafnium oxide and has a thickness between 5 and 20 nm; and the upper cap oxide layer consists essentially of silicon oxide and has a thickness between 0.2 and 1 nm.

28. The method of claim 1 wherein the charge storage layer consists essentially of tantalum oxide.

* * * * *